United States Patent [19]

Jacob

[11] 4,066,037

[45] Jan. 3, 1978

[54] APPARATUS FOR DEPOSITING DIELECTRIC FILMS USING A GLOW DISCHARGE

[75] Inventor: Adir Jacob, Framingham, Mass.

[73] Assignee: LFE Corportion, Waltham, Mass.

[21] Appl. No.: 641,441

[22] Filed: Dec. 17, 1975

[51] Int. Cl.$^2$ .............................................. C23C 13/04
[52] U.S. Cl. ..................................... 118/49.1; 427/39; 427/248 B
[58] Field of Search ................. 118/48, 49, 49.1, 49.5; 427/39, 58, 94, 248 B, 248 A, 255, 294, 40; 204/164, 177, 178

[56] References Cited

U.S. PATENT DOCUMENTS

| | | | |
|---|---|---|---|
| 2,884,894 | 5/1959 | Ruppert et al. | 118/48 |
| 3,424,661 | 1/1969 | Androshuk et al. | 427/39 X |
| 3,460,816 | 8/1969 | Miller | 118/49.1 X |
| 3,655,438 | 4/1972 | Sterling et al. | 427/39 X |
| 3,757,733 | 9/1973 | Reinberg | 118/49.5 |
| 3,847,652 | 11/1974 | Fletcher et al. | 427/40 |
| 3,880,112 | 4/1975 | Spitz et al. | 118/48 |

FOREIGN PATENT DOCUMENTS

| | | | |
|---|---|---|---|
| 730,669 | 5/1955 | United Kingdom | 118/48 |
| 1,134,352 | 11/1968 | United Kingdom | 427/94 |

OTHER PUBLICATIONS

Western Electric Company, Inc., Technical Digest No. 11, July 1968, pp. 5, 6, Apparatus for the Deposition of Silicon Nitride, R. A. Whitner.

Primary Examiner—Mervin Stein
Attorney, Agent, or Firm—Richard J. Donahue

[57] ABSTRACT

Disclosed are apparatus for forming dense and tightly adhering dielectric films on the surface of conductors, semiconductors, and insulators. The apparatus includes a reaction chamber into which a gas is admitted, dispersed, and subjected to a radio frequency exciting field to form a highly luminous glow discharge zone within the chamber. Another gas is admitted separately and is dispersed downstream from the glow discharge zone, immediately above the substrate to be coated.

4 Claims, 3 Drawing Figures

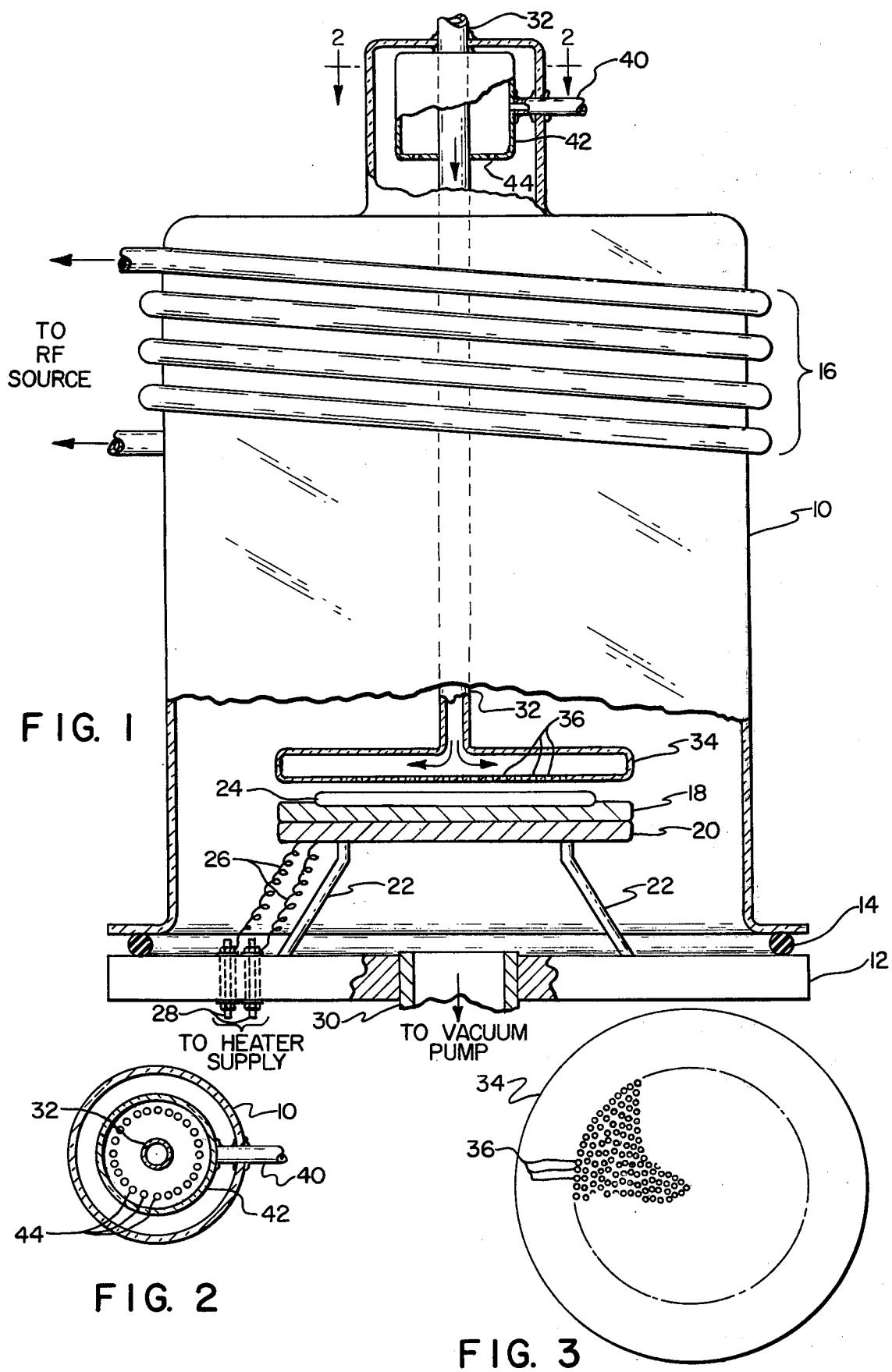

APPARATUS FOR DEPOSITING DIELECTRIC FILMS USING A GLOW DISCHARGE

FIELD OF THE INVENTION

This invention relates to apparatus for depositing dielectric films (e.g., silicon nitride, silicon oxide, silicon) on a substrate, and more particularly it concerns an improved form of such apparatus for depositing dense and tightly adhering films on a surface during the manufacture of semiconductor devices.

BACKGROUND OF THE INVENTION

It is well known that the controlled dissociation of polyatomic molecules and recombination of the resulting active species in a low pressure, low temperature glow discharge is a feasible method for depositing films on the surface of a variety of substrates. It has been observed, however, that such films which are formed by use of the glow discharge system and methods known to date, exhibit either a slow rate of growth or several undesirable film properties, such as porosity and the inclusion of contaminant substances.

It is believed that such undesirable characteristics occur at least in part because reactant gases are either premixed or otherwise introduced together into the reaction chamber in a manner whereby both gases are subject to an exciting electric field.

It is known, for example, that during the deposition of silicon nitride using silane and nitrogen gases, because of residual oxygen in the system there is a spontaneous reaction between the activated oxygen and activated silane derivatives to form silicon oxide by-products and water vapor, both of which are detrimental to the silicon nitride film properties. Further, it is believed that complex polymerization reactions associated with silane occur in a glow discharge. The main volatile products of such polymerization reactions are di- and tri-silane derivatives and hydrogen, while nonstoichiometric subhydrides separate out as precipitates. Apparently the most important initial step in the discharge reaction of silane is the breaking of the Si-H bond with the formation of either or both a sylyl or sylene intermediate. The reaction mechanism leading to sylene formation is favored because of its exothermicity.

If the reactant gases are premixed or otherwise introduced into the reaction chamber, thereby being jointly subjected to an exciting electric field, adverse ion-molecule reactions may occur and lead to highly complex reaction products. In addition to common electron impact phenomena leading to the formation of ions, single collisions of, for example, fast Si atoms or ions (because of their low ionization potential) with silane molecules, are extremely likely. The ions produced in such reactions can have relatively low kinetic energies and might therefore be expected to undergo further chemical reactions.

One of the most likely reactions to occur in such environments is hydride-ion transfer reactions which have large rate constants in silane. The following reactions in the silane system can yield products containing two silicon atoms:

$$Si^+ + SiH_4 \rightarrow Si_2H_2^+ + H_2$$

$$SiH^+ + SiH_4 \rightarrow Si_2H_3^+ + H_2$$

$$SiH_3^+ + SiH_4 \rightarrow Si_2H_3^+ + 2H$$

et cetera. These reactions are all exothermic and will be competing with nitrogen atoms for silane and its derivatives, thus inhibiting the full extent of silicon nitride formation. The possibility of foreign inclusion in the silicon nitride film of the various volatile by-products is also enhanced, thereby degrading subsequent film properties.

OBJECTS OF THE INVENTION

It is therefore an object of this invention to provide an improved apparatus for producing uniform dielectric films with negligible inclusions of foreign matter.

It is a further object of this invention to provide an apparatus for producing a uniform coating of silicon nitride on a surface of a conductor, semiconductor, or an insulator.

BRIEF SUMMARY OF THE INVENTION

The foregoing objects and others are accomplished in accordance with this invention by providing a method and apparatus for depositing dielectric films, which comprises placing the substrate in an evacuated chamber to which reactant gases are separately admitted and dispersed. One reactant gas is dispersed and subjected to an externally applied exciting field so as to form a glow discharge zone in the chamber. Another reactant gas is dispersed downstream of the glow discharge zone, immediately above the substrate, where it reacts with the activated species of the upstream-introduced reactant gas to form a substantially stiochiometric film on a substrate material.

The apparatus and methods described herein can be equally deployed for the deposition of silicon nitride, silicon oxide, and silicon films with proper selection of the reactant gases. For the purpose of illustration, a method for the deposition of silicon nitride is described below.

A substrate material like a conductor (e.g., aluminum, gold), a semiconductor (e.g., silicon, germanium), or an insulator (e.g., glass), is placed in an evacuated chamber to which nitrogen and diluted silane gases are separately admitted and dispersed. The nitrogen gas is dispersed in a manner so as to form a glow discharge zone in the chamber where it is subjected to an externally applied exciting field to form relatively long-lived ground state nitrogen atoms and metastable electronically excited nitrogen molecules. The diluted silane is dispersed downstream of the glow discharge zone, immediately above the substrate, where it reacts with the activated nitrogen atoms and molecules to form a substantially stoichiometric silicon nitride deposit or film on a substrate material.

Preferably the substrate is positioned atop an aluminum block that is recessed to accept the substrate, and the aluminum block is heated by a thermostatically controlled heating element to maintain its temperature constant at a selected value in excess of 200° C. The diluted silane is dispersed through a dispersion head having a multiplicity of small holes or jets therein which cover the area of the substrate to be coated whereby a uniform coating is achieved.

BRIEF DESCRIPTION OF THE DRAWING

FIG. 1 illustrates a glow discharge deposition system constructed in accordance with the principles of the present invention.

FIG. 2 is a section view taken along line 2—2 of FIG. 1.

FIG. 3 is a bottom view of the gas dispersion head 34 of FIG. 1.

DETAILED DESCRIPTION OF THE DRAWING

FIG. 1 illustrates a glow discharge-flow system for producing dense and adhering coatings in accordance with the present invention wherein a reaction chamber 10 is positioned atop a base plate 12 and is sealed thereto by means of an O-ring gasket 14. Chamber 10 has a generally cylindrical shape and is formed of a nonmetallic material, preferably quartz. A multiturn coil forming inductor 16 is wound about the upper portion of chamber 10 and has its ends coupled to a radio frequency power source. The RF power source would typically have a frequency of 13 megacycles and a power output of 300 watts. RF energy is coupled to the gas through the wall of the chamber 10 to form a highly luminous glow discharge zone in the chamber 10 within the zone enclosed by inductor 16.

Downstream of RF coil 16, below the gas dispersing device 34, there is a circular aluminum block or plate 18 having a thermostatically controlled heater element 20 positioned therebelow and supported on base plate 12 by legs 22. Aluminum block 18 is slightly recessed to accommodate a semiconductor substrate 24 which is typically a circular wafer having a diameter of a few centimeters.

Leads 26 which couple power to the thermostatically-controlled heating element 20 are connected to insulated feed-through terminals 28 in the base plate 12, which in turn have an external power source connected thereto. Base plate 12 has a centrally-located exhaust port 30 which is connected to a vacuum pump.

Typically, a gas containing silicon is admitted to chamber 10 via inlet tube 32. Preferably this gas consists of silane which has been diluted to a concentration of less than 5% in an inert gas. Tube 32 extends axially through chamber 10 and is coupled to a gas dispersion head 34. Tube 32 may, alternatively, extend to any point on the chamber's walls, below RF coil 16, to effect a seal and inlet of diluted silane from an external source. Gas dispersion head 34, whose bottom view is shown in FIG. 3, is circular in shape and is positioned immediately above substrate 24. A plurality of holes or jets 36 in gas dispersion head 34 uniformly distribute gas over the top surface of substrate 24 and their distance from the substrate to be coated is critical and is given in the tables below.

A gas containing nitrogen is admitted to reaction chamber 10 via inlet tube 40 which is connected to a gas dispersion device 42 located near the top of the chamber. Gas dispersion device 42, which is also shown in the sectional view 2—2 of FIG. 2, has a plurality of holes or jets 44 adapted to disperse gas uniformly through chamber 10. Preferably the gas admitted to inlet tube 40 is pure nitrogen or argon, for the deposition of silicon nitride or silicon, respectively.

For the deposition of silicon nitride, a substrate 24 is inserted within the chamber 10 and the system is pumped down by a vacuum pump to a pressure of a few microns Hg. Heating element 20 is activated to heat the substrate to a temperature approximating 300° C. Nitrogen gas is admitted to the chamber via input tube 40, and diluted silane gas is admitted to the chamber via input tube 32. The RF power source is activated so as to create a glow discharge zone within the chamber in the vicinity of inductor 16. The nitrogen gas is activated as it flows through the discharge zone defined by coil 16 to form active species thereof.

The diluted silane gas is dispersed immediately above the substrate and a reaction occurs with the activated nitrogen gas to provide a uniform coating of silicon nitride of improved quality on the surface of substrate 24. The suppression of ion formation in the deposition area, and the shielding effect of the gas dispersion head 34, void interfacial film properties of surface charge or radiation damage. This enables the potential utilization of this apparatus and method in the passivation of MOS field effect devices that are hypersensitive to interfacial charges and radiation effects.

It has been found that the gas reactants and operating parameters set forth in the tables below, when used in conjunction with the described apparatus and methods, will produce acceptable films on conducting, semiconducting, and nonconducting materials.

TABLE I

Formation of Silicon Nitride by Glow Discharge

Reactants: Pure nitrogen (99.999%) and binary mixture of silane (1.5%) in argon by volume.
System: 150 mm. O.D. quartz reaction chamber connected to 330 liters/min. mechanical vacuum pump equipped with a charged foreline trap.

| Gaseous Reactant Ratio (N:Si) | $N_2$ Pressure (μHg) | Total Pressure (μHg) | RF Power (W) | Substrate Temp. (° C) | $D^{(a)}$ (inch) | Deposition Rate (A/min) | Etch[b] Rate | Index[c] of Refraction | N-Si (wt. %)[d] Ratio in Deposited Film |
|---|---|---|---|---|---|---|---|---|---|
| 64:1 | 525 | 1075 | 100 | 320 | 15/16 | 120 | 10A/min | — | — |
| 64:1 | 670 | 1370 | 100 | 320 | 15/16 | 185 | 22A/min | 2.13 | — |
| 76:1 | 800 | 1500 | 100 | 320 | 15/16 | 200 | 1/4A/sec | 1.93 | — |
| 76:1 | 800 | 1500 | 100 | 320 | 1-1/16 | 145 | 3A/sec | — | — |
| 76:1 | 800 | 1500 | 125 | 285 | 15/16 | 175 | 4A/sec | 1.95 | — |
| 76:1 | 1600 | 3000 | 100 | 280 | 1 | 220 | 1.2A/sec | 2.09 | — |
| 76:1 | 1600 | 3000 | 125 | 320 | 1-1/32 | 250 | 1.2A/sec | 2.07 | — |
| 81:1 | 670 | 1220 | 100 | 320 | 15/16 | 145 | 0.9A/min | — | — |
| 97:1 | 800 | 1350 | 100 | 320 | 15/16 | 150 | 2A/min | 1.87 | — |
| 76:1 | 1600 | 3000 | 150 | 280 | 3/4 | 360 | 1.5A/sec | — | — |
| 76:1 | 1600 | 3000 | 125 | 280 | 1/2 | 600 | 0.5A/sec | — | — |
| 76:1 | 1600 | 3000 | 140 | 280 | 3/8 | 650 | 0.5A/sec | — | — |
| 97:1 | 1600 | 2700 | 130 | 280 | 3/8 | 550 | — | — | — |
| 131:1 | 2175 | 3275 | 140 | 280 | 3/8 | 500 | — | — | — |
| 131:1 | 2750 | 4150 | 140 | 280 | 3/8 | 500 | — | — | — |
| 131:1 | 2200 | 3300 | 175 | 300 | 3/4 | 625 | 0.35A/sec | — | — |
| 131:1 | 2200 | 3300 | 150 | 300 | 3/4 | 550 | 0.3A/sec | — | — |
| 170:1 | 2200 | 3000 | 150 | 300 | 3/4 | 475 | 0.45A/sec | — | — |
| 190:1 | 2450 | 3300 | 150 | 300 | 3/4 | 465 | 0.6A/sec | — | — |
| 300:1 | 2450 | 3000 | 150 | 300 | 3/4 | <400 | >1A/sec | — | — |
| 131:1 | 2200 | 3300 | 150 | 300 | 3/4 | 600 | 0.3A/sec | — | 23:77 |
| 131:1 | 2200 | 3300 | 200 | 300 | 3/4 | 610 | 0.4A/sec | — | 25:75 |
| 131:1 | 2200 | 3300 | 250 | 300 | 3/4 | 625 | 0.45A/sec | — | 28:72 |
| 170:1 | 2200 | 3000 | 200 | 300 | 3/4 | 500 | 0.5A/sec | — | 25:75 |

TABLE I-continued

Formation of Silicon Nitride by Glow Discharge

Reactants: Pure nitrogen (99.999%) and binary mixture of silane (1.5%) in argon by volume.
System: 150 mm. O.D. quartz reaction chamber connected to 330 liters/min. mechanical vacuum pump equipped with a charged foreline trap.

| Gaseous Reactant Ratio (N:Si) | $N_2$ Pressure ($\mu$Hg) | Total Pressure ($\mu$Hg) | RF Power (W) | Substrate Temp. (° C) | $D^{(a)}$ (inch) | Deposition Rate (A/min) | Etch$^{(b)}$ Rate | Index$^{(c)}$ of Refraction | N-Si (wt. %)$^{(d)}$ Ratio in Deposited Film |
|---|---|---|---|---|---|---|---|---|---|
| 170:1 | 2800 | 3900 | 250 | 300 | 3/4 | 550 | 0.83A/sec | — | — |
| 190:1 | 2450 | 3300 | 200 | 300 | 3/4 | 500 | 0.6A/sec | — | 32:68 |

TABLE II

Formation of Silicon Nitride Films by Glow Discharge

Reactants: Pure nitrogen (99.999%) and binary mixture of silane (3%) in argon by volume.
System: 150 mm. O.D. quartz reaction chamber connected to 330 liters/min. mechanical vacuum pump equipped with a charged foreline trap.

| Gaseous Reactant Ratio (N:Si) | $N_2$ Pressure ($\mu$Hg) | Total Pressure ($\mu$Hg) | RF Power (W) | Substrate Temp. (° C) | $D^{(a)}$ (inch) | Deposition Rate (A/min) | Etch$^{(b)}$ Rate | Index$^{(c)}$ of Refraction | N-Si (wt. %)$^{(d)}$ Ratio in Deposited Film |
|---|---|---|---|---|---|---|---|---|---|
| 150:1 | 2475 | 3025 | 250 | 300 | 3/4 | 425 | — | — | — |
| 170:1 | 2875 | 3355 | 250 | 300 | 3/4 | 400 | — | — | — |
| 190:1 | 3135 | 3685 | 250 | 300 | 3/4 | 450 | — | — | — |

TABLE III

Reactants: Pure nitrogen (99.999%) and binary mixture of silane (1.5%) in helium by volume.
System: 150 mm. O.D. quartz reaction chamber connected to 330 liters/min. mechanical vacuum pump equipped with a charged foreline trap.

| Gaseous Reactant Ratio (N:Si) | $N_2$ Pressure ($\mu$Hg) | Total Pressure ($\mu$Hg) | RF Power (W) | Substrate Temp. (° C) | $D^{(a)}$ (inch) | Deposition Rate (A/min) | Etch$^{(b)}$ Rate | Index$^{(c)}$ of Refraction | N-Si (wt. %)$^{(d)}$ Ratio in Deposited Film |
|---|---|---|---|---|---|---|---|---|---|
| 90:1 | 700 | 1220 | 150 | 300 | 1 | 120 | 10 A/min | — | — |
| 100:1 | 800 | 1333 | 150 | 300 | 1 | 150 | 11A/min | — | — |

TABLE IV

Formation of Silicon Films by Glow Discharge

Reactants: Pure argon (99.99%) and binary mixture of silane (1.5%) in argon by volume.
System: 150 mm. O.D. quartz reaction chamber connected to 330 liters/min. mechanical vacuum pump equipped with a charged foreline trap.

| Gaseous Reactant Ratio (N:Si) | $N_2$ Pressure ($\mu$Hg) | Total Pressure ($\mu$Hg) | RF Power (W) | Substrate Temp. (° C) | $D^{(a)}$ (inch) | Deposition Rate (A/min) | Etch$^{(b)}$ Rate | Index$^{(c)}$ of Refraction | N-Si (wt. %)$^{(d)}$ Ratio in Deposited Film |
|---|---|---|---|---|---|---|---|---|---|
| 76:1 | 1600 | 3000 | 140 | 280 | 1/4 | 700 | — | — | — |
| 76:1 | 800 | 1500 | 100 | 280 | 1/4 | 360 | — | — | — |
| 76:1 | 1600 | 3000 | 140 | 280 | 1/8 | 750 | — | — | — |

Legend:
$^{(a)}$Critical distance between multiple jets 36 in gas dispersing device 34 and surface of substrate 24 to be coated.
$^{(b)}$For the assessment of film density: etch rates designated in A/min refer to buffered HF etchant (45cc. HF (48%):200gr. $NH_4F$:300cc. $H_2O$); etch rates designated in A/sec refer to HF(48%) etchant. Etchants temperature: 25° C.
$^{(c)}$Measurements refer to ellipsometry at 5461 A.
$^{(d)}$Weight % ratios inferred from Auger Electron Spectroscopy determinations.

Various changes and modifications other than those mentioned may be made in the above-described apparatus and methods without deviating from the spirit or scope of the present invention, and will be apparent to those skilled in the art based on the teachings hereof. Accordingly, the scope of the invention should be defined only by the scope of the appended claims, and equivalents thereof.

I claim:

1. Apparatus for depositing a film on a substrate comprising:
   a reaction chamber,
   means for closing said chamber,
   means for continuously evacuating said chamber,
   means for dispersing a first gas within said chamber,
   gas excitation means external of said chamber for activating said first gas and forming an RF glow discharge zone within a portion of said chamber,
   substrate support means positioned within said chamber beyond said glow discharge zone,
   said substrate support means comprising a metallic plate having a recess therein for accepting a substrate and having heater means associated therewith for maintaining said plate at a temperature in excess of 200° C,
   and means for dispersing a second gas within said chamber beyond said glow discharge zone and adjacent said substrate support means,
   whereby said activated first gas and said second gas react in the vicinity of said substrate support means to deposit a film on a substrate positioned on said substrate support means.

2. Apparatus in accordance with claim 1 wherein said gas excitation means comprises a coil wound about a portion of said chamber.

3. Apparatus in accordance with claim 1 wherein said means for dispersing a first gas within said chamber comprises a cylindrically-shaped cell positioned at one end of said chamber and having a plurality of holes therein facing said glow discharge zone.

4. Apparatus in accordance with claim 1 wherein said means for dispersing a second gas within said chamber comprises a circular head having a plurality of holes therein facing said substrate support means.

* * * * *